United States Patent
Thees et al.

(10) Patent No.: US 8,735,303 B2
(45) Date of Patent: May 27, 2014

(54) METHODS OF FORMING PFET DEVICES WITH DIFFERENT STRUCTURES AND PERFORMANCE CHARACTERISTICS

(75) Inventors: Hans-Juergen Thees, Dresden (DE); Stephan Kronholz, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 156 days.

(21) Appl. No.: 13/287,403

(22) Filed: Nov. 2, 2011

(65) Prior Publication Data
US 2013/0105900 A1 May 2, 2013

(51) Int. Cl.
*H01L 21/31* (2006.01)

(52) U.S. Cl.
USPC ............ 438/771; 257/E21.284; 257/E21.285; 257/E21.286

(58) Field of Classification Search
USPC ................... 438/771; 257/E21.284, E21.285, 257/E21.286
See application file for complete search history.

(56) References Cited

U.S. PATENT DOCUMENTS

| | | | |
|---|---|---|---|
| 7,569,434 B2 | 8/2009 | Cheng et al. | |
| 7,608,489 B2 | 10/2009 | Chidambarrao et al. | |
| 7,687,338 B2 | 3/2010 | Jain et al. | |
| 7,749,847 B2 | 7/2010 | Cabral, Jr. et al. | |
| 2007/0228458 A1 | 10/2007 | Henson et al. | |
| 2011/0081754 A1 | 4/2011 | Jagannathan et al. | |

*Primary Examiner* — Amar Movva
(74) *Attorney, Agent, or Firm* — Amerson Law Firm, PLLC

(57) ABSTRACT

One illustrative method disclosed herein includes forming a first recess in a first active region of a substrate, forming a first layer of channel semiconductor material for a first PFET transistor in the first recess, performing a first thermal oxidation process to form a first protective layer on the first layer of channel semiconductor material, forming a second recess in the second active region of the semiconducting substrate, forming a second layer of channel semiconductor material for the second PFET transistor in the second recess and performing a second thermal oxidation process to form a second protective layer on the second layer of channel semiconductor material.

19 Claims, 8 Drawing Sheets

METHODS OF FORMING PFET DEVICES WITH DIFFERENT STRUCTURES AND PERFORMANCE CHARACTERISTICS

BACKGROUND OF THE INVENTION

1. Field of the Invention

Generally, the present disclosure relates to the manufacturing of sophisticated semiconductor devices, and, more specifically, to various methods of forming PFET devices with different structures and performance characteristics.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit elements that substantially determine performance of the integrated circuits. A basic field effect transistor comprises a source region, a gate region and a channel region positioned between the source and drain regions. Such a transistor further includes a gate insulation layer positioned above the channel region and a gate electrode positioned above the gate insulation layer. When an appropriate voltage is applied to the gate electrode, the channel region becomes conductive and current may flow from the source region to the drain region. In many cases, the gate electrodes are made of polysilicon. The basic structure of a field effect transistor is typically formed by forming various layers of material and thereafter patterning those layers of material using known photolithography and etching processes. Various doped regions, e.g., source regions, drain regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits millions of transistors, e.g., NFET transistors and/or PFET transistors are formed on a substrate by performing a number of process operations.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NFET transistors and create a compressive stress in the channel region for PFET transistors). One performance-enhancing technique that has been employed in manufacturing PFET transistors involves the use of a silicon germanium channel layer. Such a silicon germanium channel layer is typically formed by forming a recess in an active region of a substrate where such a PFET transistor will be formed and thereafter, performing an epitaxial deposition process to form a layer of silicon germanium in the recess. Other semiconductor devices, such as NFET transistors that are being formed on the same substrate, are typically masked while the silicon germanium channel layer is being formed for the PFET transistors. The incorporation of the silicon germanium channel layer enhances the performance of the PFET transistor by bringing the threshold voltage of the device to a desired level (adjusting the work function to the needs of high-K metal gates).

As noted earlier, a typical integrated circuit product may include millions of PFET transistors. However, not all of the PFET transistors perform the same function. That is, in some cases, it would be desirable for the PFET transistors on a substrate to have different performance characteristics. For example, by adjusting the threshold voltage of the PFET transistors with implantations and different mask layers, one can either form a high threshold voltage (low off-current, low performance due to the reduced on-current) device or a low threshold voltage device (high on-current, high performance, but also higher off-current). For high-K metal gate PFETs this approach has the drawback that very high implant doses and counter-doping are required and still the threshold voltage shift attributed to the dose and thickness chosen for the silicon germanium region would present the major and limiting factor for the achievable threshold voltage range and the transistor performance.

To avoid the drawbacks of high implant doses like e.g. high cost, long processing times and high implant damage of the substrate and to allow a wider range of achievable threshold voltages for the high-K metal gate PFETs, the formation of individual silicon germanium regions tailored for the individual performance requirements of the PFETs is needed.

The present disclosure is directed to various methods of forming PFET devices with different structures and performance characteristics that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming PFET devices with different structures and performance characteristics. In one example, the method includes forming a first recess in a first active region of the semiconducting substrate while masking a second active region of the substrate, forming a first layer of channel semiconductor material for a first PFET transistor in the first recess, performing a first thermal oxidation process to form a first protective layer on the first layer of channel semiconductor material and forming a second recess in the second active region of the semiconducting substrate. The method concludes with the steps of forming a second layer of channel semiconductor material for the second PFET transistor in the second recess and performing a second thermal oxidation process to form a second protective layer on the second layer of channel semiconductor material, wherein at least one of a thickness of the first and second channel semiconductor materials or a concentration of germanium in the first and second channel semiconductor materials are different.

In another example, an illustrative device disclosed herein include a first PFET transistor formed in and above a first active region of a semiconducting substrate, wherein the first PFET transistor comprises a first layer of channel semiconductor material, and a second PFET transistor formed in and above a second active region of the semiconducting substrate, wherein the second PFET transistor comprises a second layer of channel semiconductor material, and wherein at least one of a thickness of the first and second channel semiconductor materials or a concentration of germanium in the first and second channel semiconductor materials are different.

BRIEF DESCRIPTION OF THE DRAWINGS

The disclosure may be understood by reference to the following description taken in conjunction with the accompanying drawings, in which like reference numerals identify like elements, and in which.

Figure 1A:
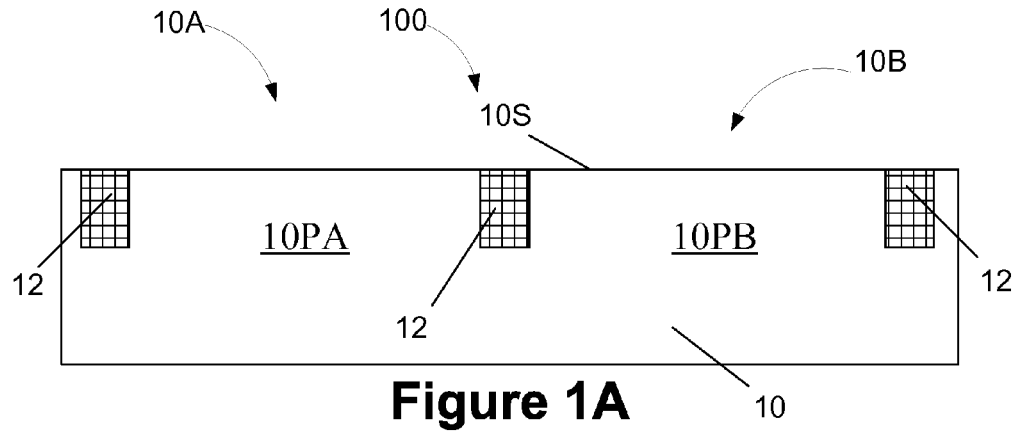
FIGS. 1A-1G depict various illustrative methods of forming PFET devices with different structures and performance characteristics.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming PFET devices with different structures and performance characteristics. As will be readily apparent to those skilled in the art upon a complete reading of the present application, the present method is applicable to a variety of devices, including, but not limited to, logic devices, memory devices, etc. With reference to FIGS. 1A-1G, various illustrative embodiments of the methods disclosed herein will now be described in more detail.

FIG. 1A is a simplified view of an illustrative semiconductor device 100 at an early stage of manufacturing. The semiconductor device is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In general, illustrative trench isolation structures 12 separate the substrate 10 in to two P-active regions 10PA, 10PB wherein PFET transistors 10A, 10B, respectively, will be formed. The trench isolation regions 12 may be formed by performing well known etching, deposition and polishing processes. Although the regions 10PA and 10PB are depicted in the drawings as being adjacent to one another, in practice the regions 10A, 10B may be spaced apart from one another on the substrate 10. In some cases, other types of semiconductor devices, such as NFET devices, memory devices, resistors, etc., may be positioned between the illustrative active regions 10PA, 10PB. Moreover, the size and configurations of the active regions may vary depending upon the particular application, and the active regions 10PA, 10PB need not be of the same size and configuration, although they may be so configured. Although not depicted in the drawings, one or more ion implantation processes may have been performed on the substrate 10 to introduce the desired dopant materials into the active regions 10PA, 10PB such that PFET transistors may be formed in and above the active regions 10PA, 10PB.

Figure 1B:
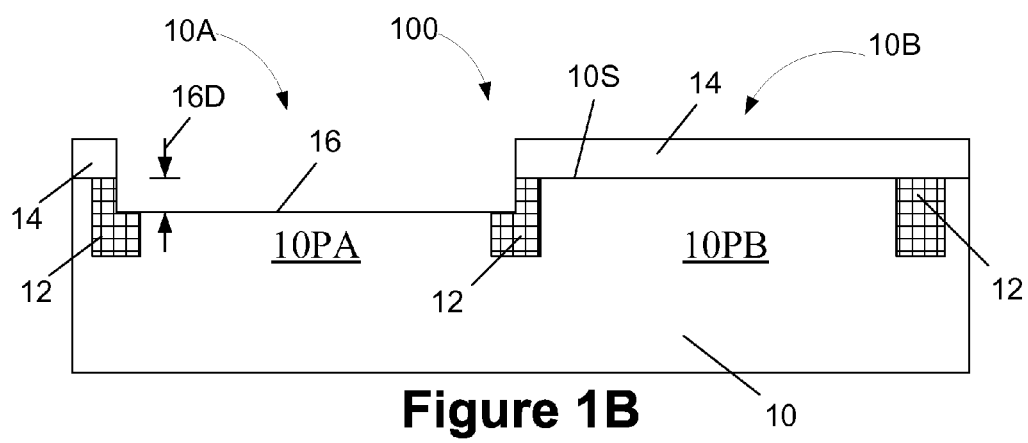

As shown in FIG. 1B, a schematically depicted patterned mask layer 14 is formed above the substrate 10. The patterned mask layer 14 is intended to be representative in nature in that it may be comprised or a variety of materials and it may be comprised of one or more layers of materials. For example, in one illustrative embodiment, the patterned mask layer 14 may be a so-called pad oxide layer and a hard mask layer formed on top of the pad oxide layer. In one illustrative embodiment, the pad oxide layer may be comprised of, for example, silicon dioxide, it may be formed by either a thermal growth process or by a deposition process, such as a chemical vapor deposition (CVD) process, and it may have a thickness of about 2-5 nm. In one illustrative example, such a hard mask layer may be comprised of, for example, silicon nitride, it may have a thickness of about 10-25 nm and it may be formed by performing a CVD process. The mask layer(s) 14 may be a patterned by forming a patterned layer of photoresist (not shown) above the mask layer(s) and thereafter performing one or more etching processes through such a photoresist mask. In the depicted example, the mask layer 14 covers the active region 10B while leaving the active region 10A exposed for further processing. Of course, if desired, the exposed and covered active regions could be reversed.

With continuing reference to FIG. 1B, in one illustrative process flow, the next process operation involves forming a recess 16 in the active region 10PA. The recess 16 may have a depth 16D (relative to the surface 10S of the substrate 10) that may vary depending upon the application and the desired performance characteristics of the PFET transistor 10A to be formed in and above the active region 10PA. In one illustrative embodiment, the depth 16D of the recess 16 may range from about 5-15 nm. The recess 16 may be formed by performing a wet or dry etching process through the mask layer 14. In one illustrative embodiment, the recess 16 may be formed by performing dry reactive ion etching (RIE) process on the active region 10PA through the mask layer 14. Depending upon the etch chemistry employed in forming the recess 16, and the material used for the isolation structures 12, i.e., silicon dioxide, a portion of the isolation structure 12 may be consumed during the process of forming the recess 16, as depicted in FIG. 1B.

Figure 1C:
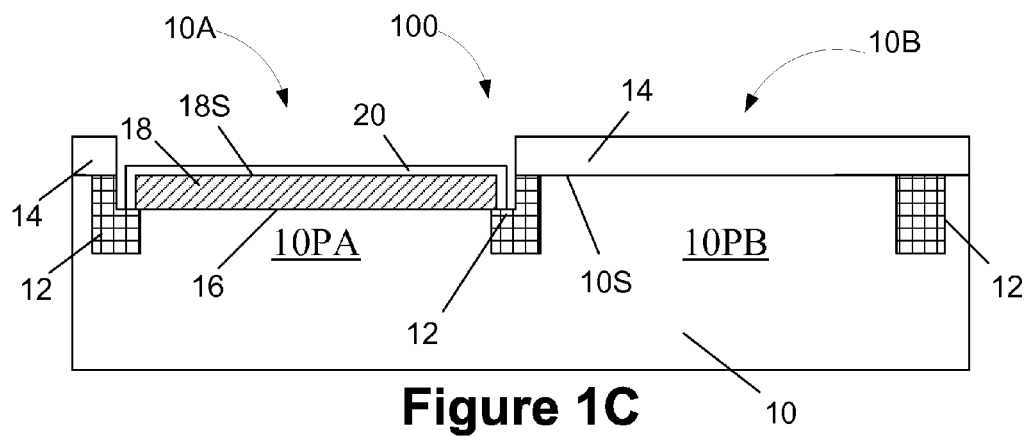

Next, as shown in FIG. 1C, after the recess 16 is cleaned, a channel semiconductor material 18, e.g., a layer of silicon germanium, is formed in the recess 16. The semiconductor material 18 may have a thickness that corresponds approximately to the depth 16D of the recess 16. In some cases, the upper surface 18S of the semiconductor material 18 may be approximately even with the upper surface 10S of the substrate 10. The thickness of the semiconductor material 18 and/or the concentration of germanium in the semiconductor material 18 may vary depending upon the application and the desired performance characteristics of the PFET transistor 10A to be formed in and above the active region 10PA. In one illustrative embodiment, the semiconductor material 18 may be a layer of silicon germanium that is formed by performing an epitaxial deposition, wherein the layer of silicon germanium may have a germanium concentration within the range of 20-40%. In one illustrative embodiment, the thickness of the semiconductor material layer 18 may fall within the range of about 5-15 nm.

With continuing reference to FIG. 1C, in one illustrative process flow, the next process operation involves forming a protective layer 20 on the semiconductor material layer 18. In one illustrative embodiment, the thickness of the protective layer 20 may range from about 2-5 nm. The protective layer 20 may be formed by performing a thermal growth process. In one illustrative embodiment, the protective layer 20 is a layer comprised essentially of silicon dioxide and it may be formed by performing a rapid thermal anneal (RTA) process at a temperature of about 950-1150 C for a duration of about 5-20 seconds or so (depending upon the desired thickness of the protective layer 20) in a diluted oxygen environment. The anneal process may be performed in the same process chamber used in forming the semiconductor material 18, i.e., an in situ process, or it may be a stand-alone process performed in a separate processing tool. The anneal process acts to essentially drive the germanium material inward, away from the top surface of the channel semiconducting material 18. In turn, this will allow the thermal oxidation process to form a layer, i.e., the protective layer 20 that is comprised mostly of silicon dioxide.

Figure 1D:
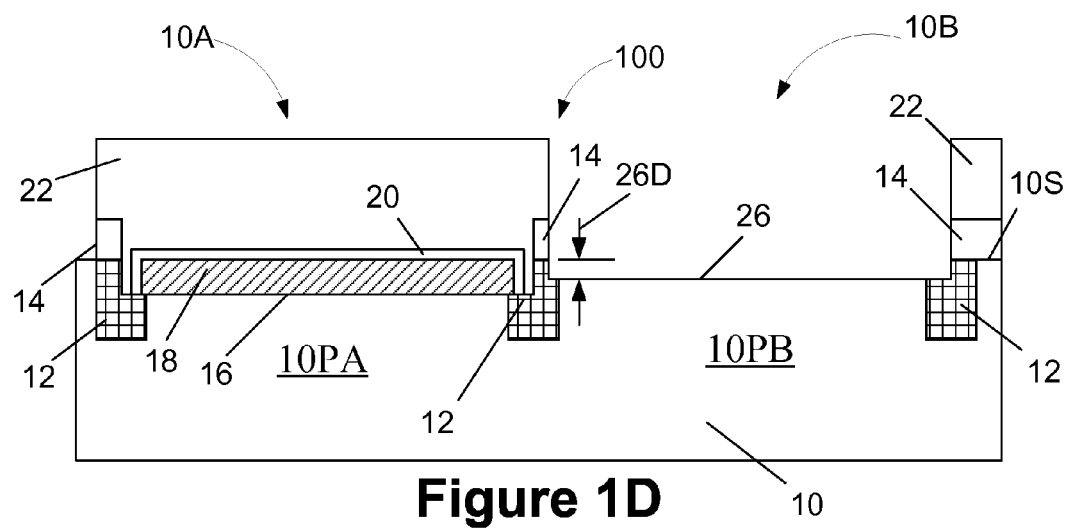

As shown in FIG. 1D, a schematically depicted patterned mask layer 22 is formed above the substrate 10. The patterned mask layer 22 is intended to be representative in nature in that it may be comprised or a variety of materials and it may be comprised of one or more layers of materials. In the depicted example, the mask layer 22 covers the active region 10PA while leaving the active region 10PB exposed for further processing. In one illustrative embodiment, the patterned mask layer 22 may be a patterned layer of photoresist that may be formed using known photolithography tools and techniques.

With continuing reference to FIG. 1D, in one illustrative process flow, the next process operation involves forming a recess 26 in the active region 10PB. The recess 26 may have a depth 26D (relative to the surface 10S of the substrate 10) that may vary depending upon the application and the desired performance characteristics of the PFET transistor 10B to be formed in and above the active region 10PB. In one illustrative embodiment, the depth 26D of the recess 26 may range from about 5-15 nm. The recess 26 may be formed by performing a wet or dry etching process through the mask layer 22. In one illustrative embodiment, the recess 26 may be formed by performing dry reactive ion etching (RIE) process on the active region 10PB through the mask layer 22. Depending upon the etch chemistry employed in forming the recess 26, and the material used for the isolation structures 12 proximate the active region 10PB, i.e., silicon dioxide, a portion of the isolation structure 12 may be consumed during the process of forming the recess 16, as depicted in FIG. 1D. Using the novel methods disclosed herein, the depths 16D, 26D of the recesses 16, 26, respectively, may be formed to different depths so that ultimately the electrical performance characteristics of PFET transistors 10A, 10B, to be formed above semiconductor material to be formed in such recesses 16, 26 may be adjusted based upon, at least in part, the thickness of the semiconductor material formed in the recesses 16, 26.

Figure 1E:
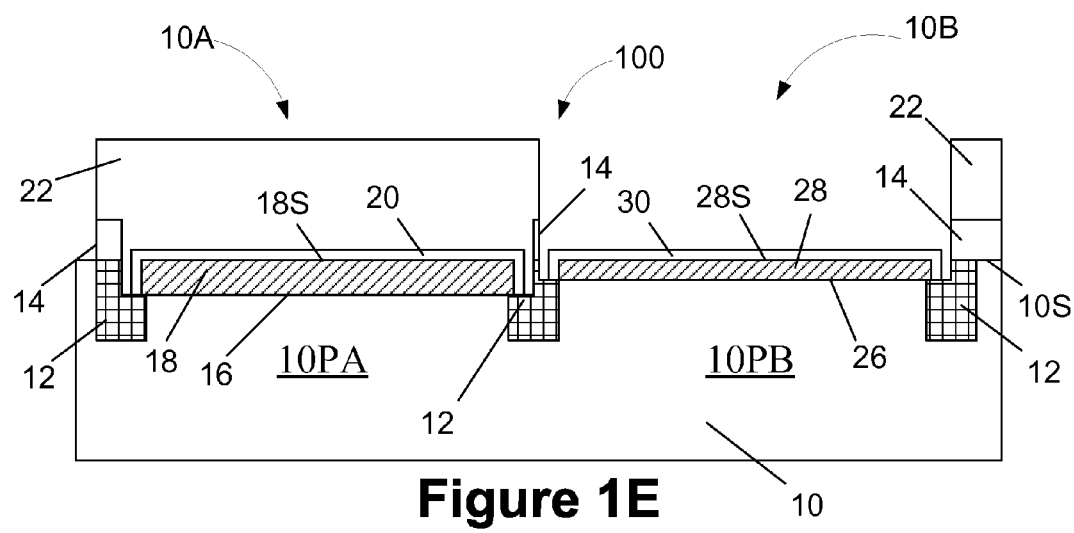

Next, as shown in FIG. 1E, after the recess 26 is cleaned, a channel semiconductor material 28, e.g., a layer of silicon germanium, is formed in the recess 26. The semiconductor material 28 may have a thickness that corresponds approximately to the depth 26D of the recess 26. In some cases, the upper surface 28S of the semiconductor material 28 may be approximately even with the upper surface 10S of the substrate 10. The thickness of the semiconductor material 28 and/or the concentration of germanium in the semiconductor material 28 may vary depending upon the application and the desired performance characteristics of the PFET transistor 10B to be formed in and above the active region 10PB. In one illustrative embodiment, the semiconductor material 28 may be a layer of silicon germanium that is formed by performing an epitaxial deposition, wherein the layer of silicon germanium may have a germanium concentration within the range of 20-40%. In one illustrative embodiment, the thickness of the semiconductor material layer 28 may fall within the range of about 5-15 nm.

With continuing reference to FIG. 1E, in one illustrative process flow, the next process operation involves forming a protective layer 30 on the channel semiconductor material layer 28. In one illustrative embodiment, the thickness of the protective layer 30 may range from about 2-5 nm. The protective layer 30 may be formed by performing the process operations described above for the protective layer 20.

Figure 1F:
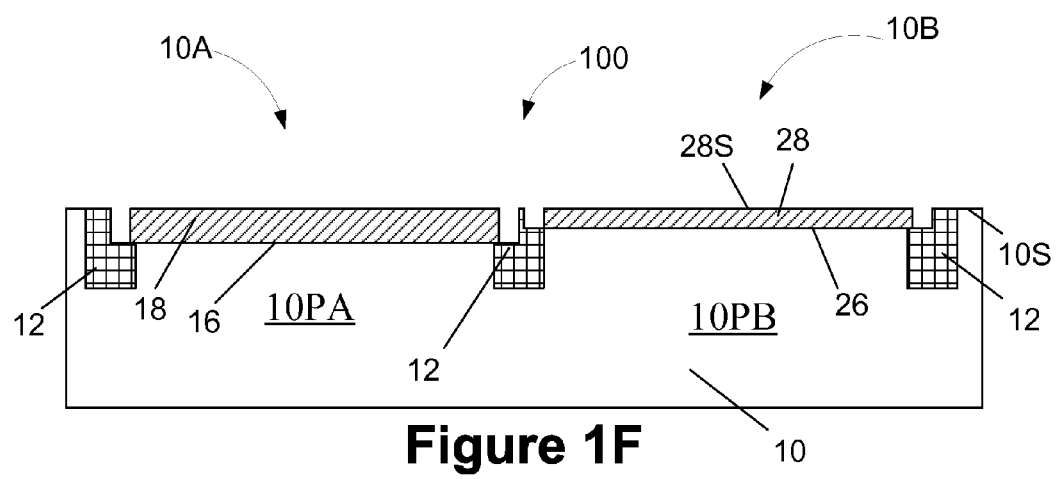

Next, as shown in FIG. 1F, various cleaning operations may be performed on the device 100 to remove the mask layer 22 and the remaining portions of the mask layer 14. At this point in the process flow, the protection layers 20, 30 may remain in place to protect the semiconductor materials 18, 28 while additional process operations are performed on other parts of the substrate 10. For example, the protection layers 20, 30 may remain in place while various etching processes are performed to form resistor structures or NFET devices. Ultimately, as shown in FIG. 1F, one or more cleaning operations will be performed to remove the protective layers 20, 30 so that the formation of the PFET transistors 10A, 10B can be completed.

Figure 1G:
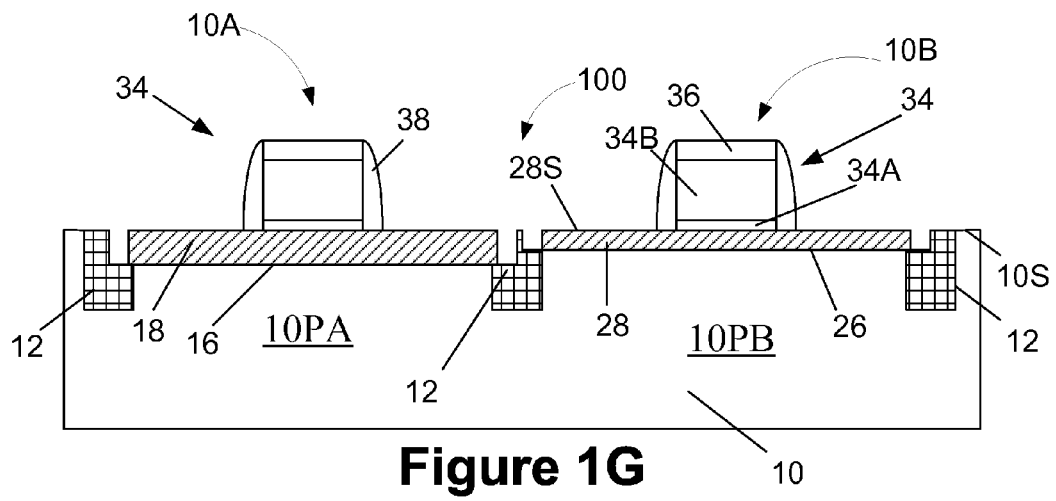

FIG. 1G is a schematic depiction of illustrative gate structures 34 formed on the device 100. In one embodiment, the gate structures 34 are comprised of a gate insulation layer 34A and a gate electrode 34B. Also depicted in FIG. 1G is an illustrative gate cap layer 36 and sidewall spacers 38. Of course, those skilled in the art will recognize that the schematically depicted transistors 10A, 10B do not show all aspects of a real-world PFET transistor, such as various doped regions, various conductive contacts, etc. The gate insulation layer 34A may be comprised of a variety of different materials, such as, for example, silicon dioxide, a so-called high-k (k greater than 10) insulation material, etc. Similarly, the gate electrode 34B may be made of a material such as polysilicon or amorphous silicon, or it may be comprised of one or more metal layers. As will be recognized by those skilled in the art after a complete reading of the present application, the gate structures 34 for the transistors 10A, 10B may be comprised of a variety of different materials and such gate structures 34 may have a variety of configurations. Moreover, the gate structures 34 may be made using either so-called "gate-first" or "gate-last" techniques. The materials of construction for the gate structure 34 for the transistor 10A may be the same or different than the materials of construction for the gate structure 34 for the transistor 10B. Thus, the particular materials employed in the formation of the gate structures 34 and the manner in which they are made should not be considered a limitation of the presently disclosed inventions.

As will be recognized by those skilled in the art after a complete reading of the present application, the methods disclosed herein enable the formation of PFET transistors on a substrate 10 having different structures and difference performance characteristics. For example, the thickness of the semiconductor materials 18, 28 may intentional made to be different so as to change the electrical characteristics of the transistors 10A, 10B. In one illustrative embodiment, the semiconductor material 18 may have a thickness of about 20 nm while the semiconductor material 28 may have a thickness of about 10 nm. In general, all other things being equal, a PFET transistor with a thicker layer of semiconductor material will tend to exhibit a lower threshold voltage and higher performance as compared to a PFET transistor with a semiconductor material having a lesser thickness. It should also be noted that in some embodiments it may generally be desirable to form the thicker of the semiconductor materials 18, 28 first.

Similarly, the germanium concentration in the semiconductor materials 18, 28 may intentional made to be different so as to change the electrical characteristics of the transistors 10A, 10B. In one illustrative embodiment, the semiconductor material 18 may have a germanium concentration of about 20-25% while the semiconductor material 28 may have a germanium concentration of about 35-40%. In general, all other things being equal, a PFET transistor with a semiconductor material having higher germanium concentration will tend to exhibit a lower threshold voltage and higher performance as compared to a PFET transistor with a semiconductor material having a lesser germanium concentration. These two "control knobs"—thickness and germanium concentration of the channel semiconductor materials for the PFET transistors—may be employed in combination or separately to impart the desired electrical performance characteristics on the subject PFET transistors.

FIGS. 2A-2E depict other illustrative methods disclosed herein for forming PFET devices 10A, 10B with different structures and performance characteristics along with other semiconductor devices on the same substrate 10. FIGS. 2A-2E depict different portions of the same substrate 10. The upper portion in each of these drawings depicts the P-active regions 10PA, 10PB where the PFET transistors 10A, 10B will be formed while the lower portions of FIGS. 2A-2E depict other areas of the substrate 10 where semiconductor device other than the PFET transistors 10A, 10B will be formed.

More specifically, when the isolation structures 12 were formed, they separated the substrate 10 in to two active regions 10PA, 10PB wherein PFET transistors 10A, 10B, respectively, will be formed, and they also defined an N-active region 10N and a memory region 10M. In the illustrative embodiment described in FIGS. 2A-2E, an illustrative NFET transistor 11A will be formed in and above the N-active region 10N while an illustrative embedded DRAM device 11B will be formed in and above the memory region 10M. The various regions 10PA, 10PB, 10N and 10M may be spaced apart from one another on the substrate 10. The size and configurations of the active regions 10N, 10M may vary depending upon the particular application, and the active regions 10PA, 10PB, 10N, 10M need not be of the same size and configuration, although they may be so configured. Although not depicted in the drawings, one or more ion implantation processes may have been performed on the substrate 10 to introduce the desired dopant materials into the active regions 10N, 10M. Additionally, at the time the mask layer 14 was formed it was formed so as to cover the regions 10N, 10M, then the previously described process operations in connection with the formation of the PFET transistors 10A, 10B proceeded. Of course, as noted earlier, the mask layer 14 is representative in nature in that it may be comprised of a variety of materials and it may be comprised of one or more layers of materials, e.g., the illustrative mask layer 14 may have a dual layer construction comprised of a so-called pad oxide layer and a hard mask layer formed on top of the pad oxide layer.

Figure 2A:
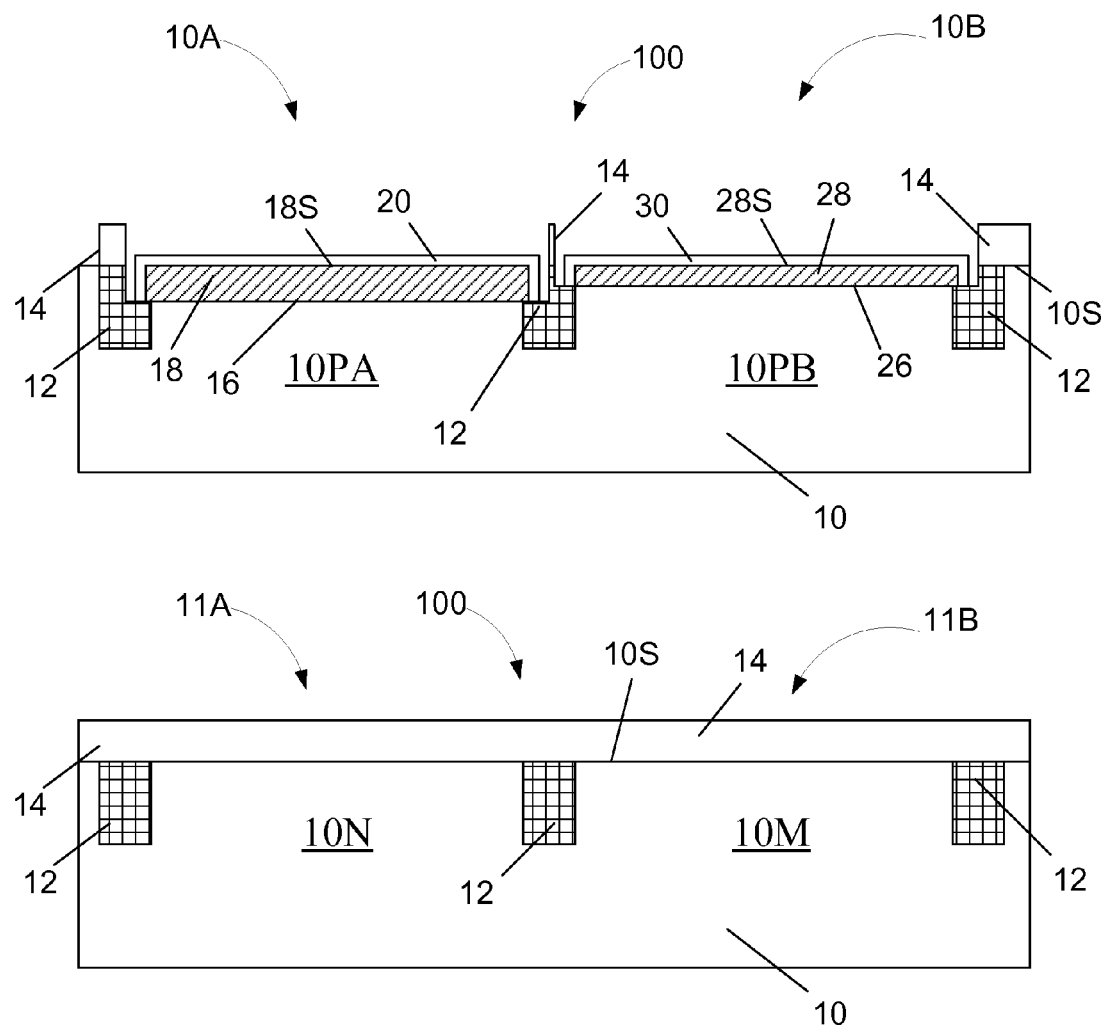
FIGS. 2A-2E depict other illustrative methods disclosed herein for forming PFET devices with different structures and performance characteristics along with other semiconductor devices on the same substrate.
Figure 2B:
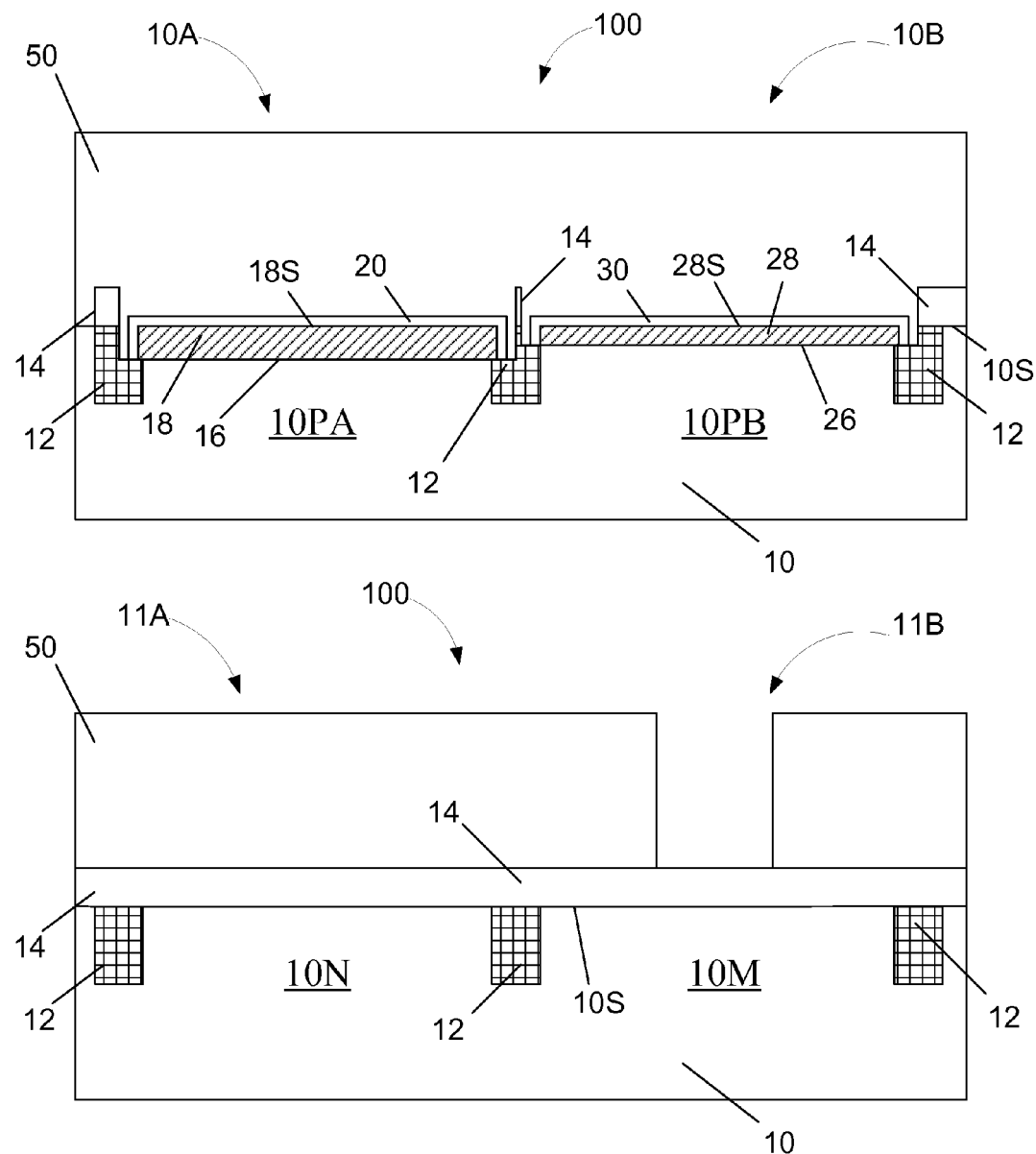
Figure 2C:
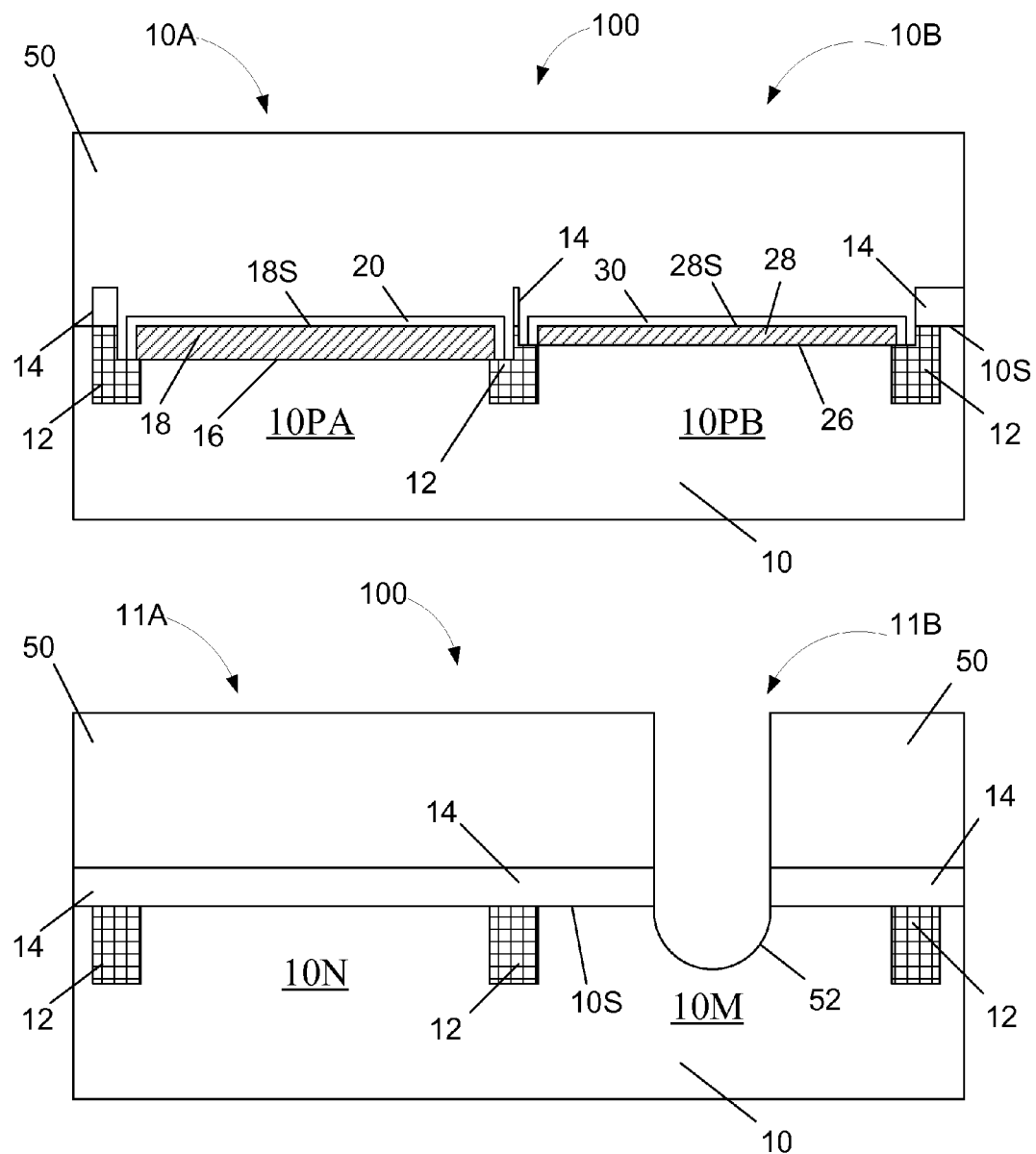
Figure 2D:
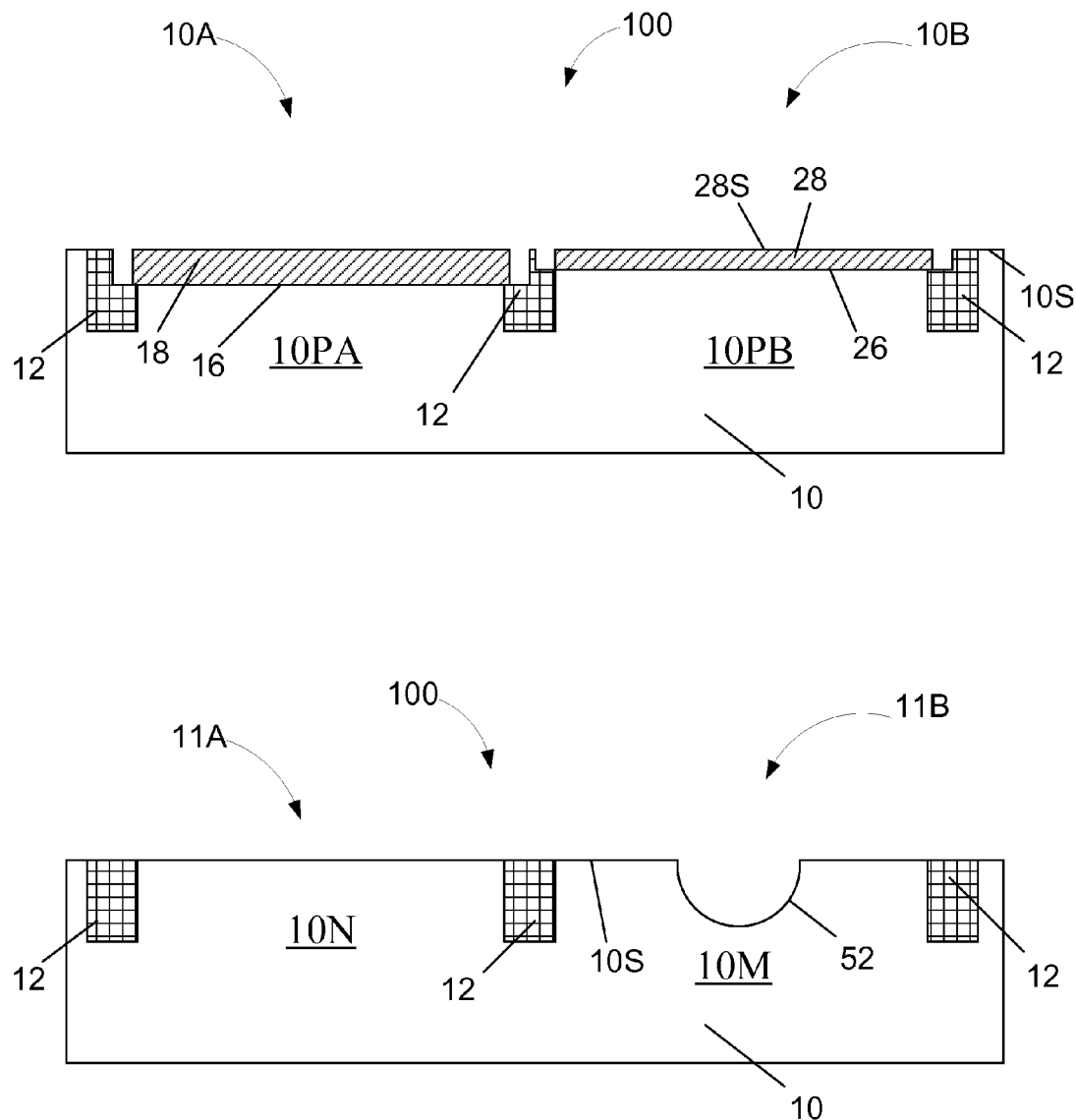

At the point of fabrication depicted in FIG. 2A, the protection layers 20, 30 have been formed over the semiconductor materials 18, 28 as previously described, and the active regions 10N, 10M remain covered by the mask layer 14. Next, as shown in FIG. 2B, a patterned mask layer 50, e.g., a photoresist mask is formed above the device 100. In this particular example, the patterned mask layer 50 covers the regions 10PA, 10PB, and 10N and exposes a portion of the region 10M for further processing. Thereafter, as shown in FIG. 2C, one or more etching process are performed through the patterned mask layer 50 to define a channel 52 in the substrate 10 for the illustrative embedded DRAM device 11B to be formed in and above the active region 10M. The basic structure of such embedded DRAM devices are well known to those skilled in the art. Then, as shown in FIG. 2D, the patterned mask layer 50 is removed by performing, for example, an ashing process. Thereafter, the mask layer 14 is removed by performing one or more etching processes. As part of the process of removing the mask layer 14, the protection layers 20, 30 are also removed from the channel semiconductor materials 18, 28. At the point of fabrication depicted in FIG. 2D, additional processing operations may be performed to form the desired semiconductor devices above the substrate 10.

Figure 2E:
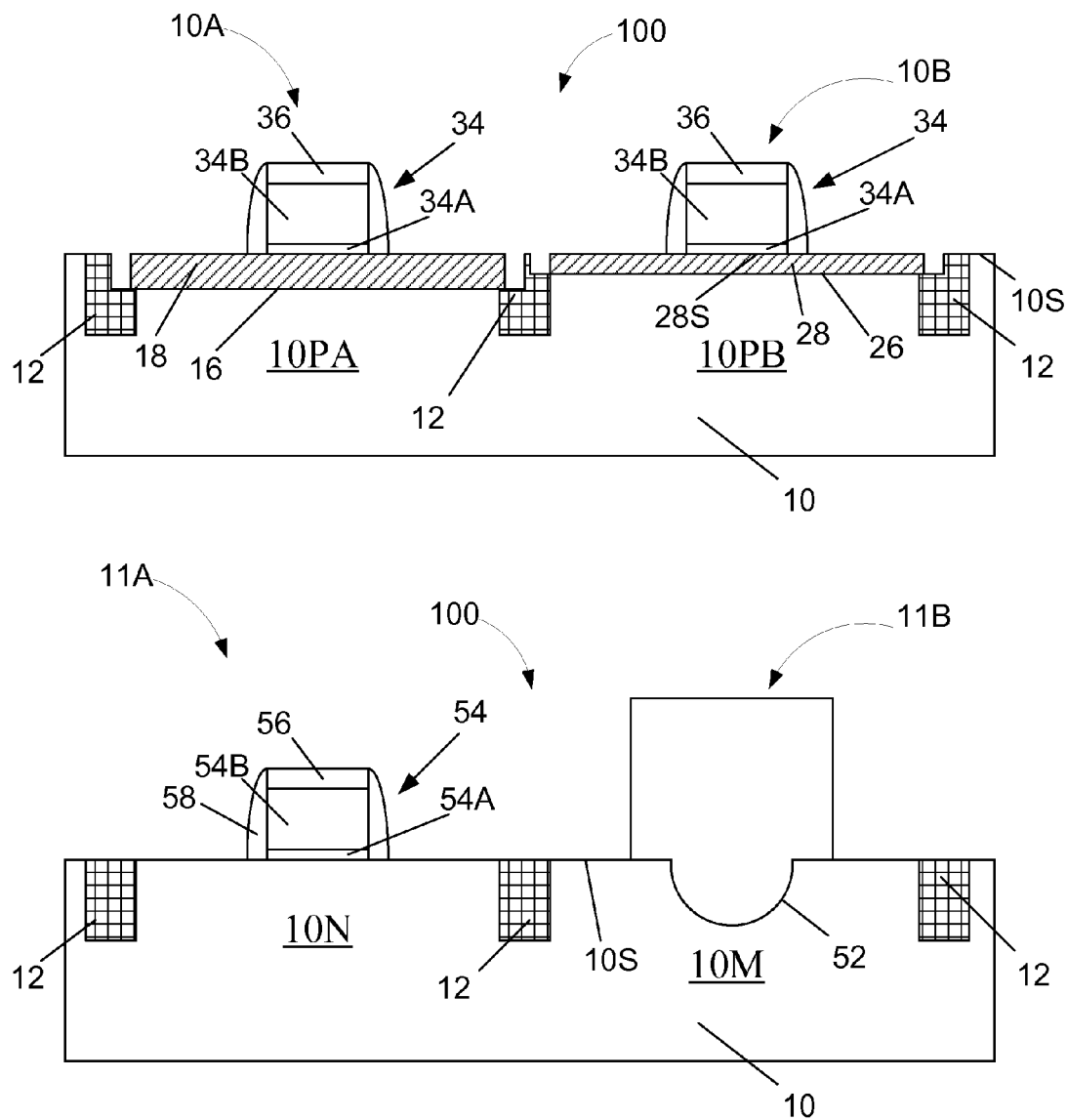

FIG. 2E schematically depicts the formation of the PFET transistors 10A, 10B, the NFET transistor 11A and the embedded DRAM device 11B in and above the various regions of the substrate 10. The illustrative NFET transistor 11A comprises an illustrative gate structures 54 that includes a gate insulation layer 54A and a gate electrode 54B. The illustrative NFET transistor 11A also comprises an illustrative gate cap layer 56 and sidewall spacers 58. Of course, those skilled in the art will recognize that the schematically depicted NFET transistor 11A does not show all aspects of a real-world NFET transistor, such as various doped regions, various conductive contacts, etc. The gate insulation layer 54A may be comprised of a variety of different materials, such as, for example, silicon dioxide, a so-called high-k (k greater than 10) insulation material, etc. Similarly, the gate electrode 54B may be made of a material such as polysilicon or amorphous silicon, or it may be comprised of one or more metal layers. As will be recognized by those skilled in the art after a complete reading of the present application, the gate structure 54 for the NFET transistor 11A may be comprised of a variety of different materials and the gate structures 54 may have a variety of configurations. Moreover, the gate structures 54 may be made using either so-called "gate-first" or "gate-last" techniques. Thus, the particular materials employed in the formation of the gate structure 54 and the manner in which it is made should not be considered a limitation of the presently disclosed inventions. Similarly, the particular details of construction of the embedded DRAM device 11B should not be considered to be a limitation of the present inventions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming first PFET transistor in and above a first active region of a semiconducting substrate and a second PFET transistor in and above a second active region of said semiconducting substrate, the method comprising:
    forming a first recess in said first active region of said semiconducting substrate while masking said second active region;
    forming a first layer of channel semiconductor material for said first PFET transistor in said first recess;
    performing a first thermal oxidation process to form a first protective layer on said first layer of channel semiconductor material;
    forming a second recess in said second active region of said semiconducting substrate;
    forming a second layer of channel semiconductor material for said second PFET transistor in said second recess; and
    performing a second thermal oxidation process to form a second protective layer on said second layer of channel semiconductor material, wherein at least one of a thickness of said first and second layers of channel semiconductor materials or a concentration of germanium in said first and second layers of channel semiconductor materials are different.

2. The method of claim 1, wherein said first layer of channel semiconductor material is thicker than said second layer of channel semiconductor material and said concentration of said germanium in said first layer of channel semiconductor material is greater than said concentration of said germanium in said second layer of channel semiconductor material.

3. The method of claim 1, wherein said first layer of channel semiconductor material is thicker than said second layer of channel semiconductor material and said concentration of said germanium in said first layer of channel semiconductor material is less than said concentration of said germanium in said second layer of channel semiconductor material.

4. The method of claim 1, wherein said first layer of channel semiconductor material is thinner than said second layer of channel semiconductor material and said concentration of said germanium in said first layer of channel semiconductor material is greater than said concentration of said germanium in said second layer of channel semiconductor material.

5. The method of claim 1, wherein said first layer of channel semiconductor material is thinner than said second layer of channel semiconductor material and said concentration of said germanium in said first layer of channel semiconductor material is less than said concentration of said germanium in said second layer of channel semiconductor material.

6. The method of claim 1, wherein, prior to forming said second recess in said second active region of said semiconducting substrate, forming a masking layer above said first protective layer.

7. The method of claim 1, wherein performing said first thermal oxidation process comprises performing a heating process at a temperature within the range of about 950-1150° C. in an oxidizing ambient.

8. The method of claim 7, wherein said heating process is performed for a duration of about 5-20 seconds.

9. The method of claim 1, wherein performing said second thermal oxidation process comprises performing a heating process at a temperature within the range of about 950-1150° C. in an oxidizing ambient.

10. The method of claim 9, wherein said heating process is performed for a duration of about 5-20 seconds.

11. The method of claim 1, wherein said concentration of said germanium in said first layer of channel semiconductor material is less than said concentration of said germanium in said second layer of channel semiconductor material.

12. The method of claim 1, wherein said concentration of said germanium in said first layer of channel semiconductor material is greater than said concentration of said germanium in said second layer of channel semiconductor material.

13. The method of claim 1, wherein said first layer of channel semiconductor material is thicker than said second layer of channel semiconductor material.

14. The method of claim 1, wherein said first layer of channel semiconductor material is thinner than said second layer of channel semiconductor material.

15. The method of claim 1, wherein said first and second protective layers are comprised of silicon dioxide.

16. The method of claim 1, wherein said first and second layers of channel semiconductor materials are comprised of silicon germanium.

17. The method of claim 1, further comprising performing at least one etching process to define a channel in said substrate for an embedded DRAM device formed in and above said substrate while said first and second protective layers are in place on said first and second layers of channel semiconductor materials, respectively.

18. A method of forming first PFET transistor in and above a first active region of a semiconducting substrate and a second PFET transistor in and above a second active region of said semiconducting substrate, the method comprising:
    forming a first recess in said first active region of said semiconducting substrate while masking said second active region;
    performing a first epitaxial deposition process to form a first layer of channel silicon germanium material for said first PFET transistor in said first recess;

performing a first thermal oxidation process to form a first protective layer comprised of silicon dioxide on said first layer of channel silicon germanium material;

forming a second recess in said second active region of said semiconducting substrate;

performing a second epitaxial deposition process to form a second layer of channel silicon germanium material for said second PFET transistor in said second recess; and performing a second thermal oxidation process to form a second protective layer comprised of silicon dioxide on said second layer of channel silicon germanium material, wherein at least one of a thickness of said first and second channel silicon germanium materials or a concentration of germanium in said first and second channel silicon germanium materials are different.

19. The method of claim 18, further comprising performing at least one etching process to define a channel in said substrate for an embedded DRAM device formed in and above said substrate while said first and second protective layers are in place on said first and second layers of silicon germanium materials, respectively.

\* \* \* \* \*

UNITED STATES PATENT AND TRADEMARK OFFICE
CERTIFICATE OF CORRECTION

PATENT NO. : 8,735,303 B2  Page 1 of 1
APPLICATION NO. : 13/287403
DATED : May 27, 2014
INVENTOR(S) : Thees et al.

It is certified that error appears in the above-identified patent and that said Letters Patent is hereby corrected as shown below:

On the Title Page, Item (54) and in the Specification, Column 1, line 1 of the TITLE, delete "PEET" and insert therefor -- PFET --.

Signed and Sealed this
Fifth Day of August, 2014

Michelle K. Lee
*Deputy Director of the United States Patent and Trademark Office*